United States Patent
Nikkhoo et al.

(10) Patent No.: US 9,837,682 B1
(45) Date of Patent: Dec. 5, 2017

(54) VARIABLE LAYER THICKNESS IN CURVED BATTERY CELL

(71) Applicants: Michael Nikkhoo, Saratoga, CA (US); Vijayasekaran Boovaragavan, Cupertino, CA (US); Dongli Zeng, Fremont, CA (US); Tzu-Yuan Lin, San Jose, CA (US); John Christopher Collins, San Jose, CA (US)

(72) Inventors: Michael Nikkhoo, Saratoga, CA (US); Vijayasekaran Boovaragavan, Cupertino, CA (US); Dongli Zeng, Fremont, CA (US); Tzu-Yuan Lin, San Jose, CA (US); John Christopher Collins, San Jose, CA (US)

(73) Assignee: MICROSOFT TECHNOLOGY LICENSING, LLC, Redmond, WA (US)

(*) Notice: Subject to any disclaimer, the term of this patent is extended or adjusted under 35 U.S.C. 154(b) by 0 days.

(21) Appl. No.: 15/250,628

(22) Filed: Aug. 29, 2016

(51) Int. Cl.
*H01M 10/04* (2006.01)
*H01M 2/20* (2006.01)
(Continued)

(52) U.S. Cl.
CPC ........ *H01M 10/0436* (2013.01); *G06F 1/163* (2013.01); *G06F 1/1613* (2013.01);
(Continued)

(58) Field of Classification Search
CPC .. H01M 10/0436; H01M 2/1673; H01M 2/18; H01M 2/204; H01M 6/02; G06F 1/1613; G06F 1/163
(Continued)

(56) References Cited

U.S. PATENT DOCUMENTS 3,708,729 A * 1/1973 Berger .................... H01M 6/18
                                                        252/62.2
3,790,775 A * 2/1974 Rosenblatt ............... A44C 5/00
                                                        362/104
(Continued)

FOREIGN PATENT DOCUMENTS

WO      WO 0182393 A2 * 11/2001 .......... H01M 2/0207
WO     WO 2013062662 A1 * 5/2013 ........ H01M 10/0431
(Continued)

OTHER PUBLICATIONS

Petrovan, Bogdan., "LG Announces Curved Battery, Cable-Shaped Design Coming in the Future", Published on: Oct. 8, 2013 Available at: http://www.androidauthority.com/lg-curved-battery-281444/.
(Continued)

*Primary Examiner* — Hai V Nguyen
(74) *Attorney, Agent, or Firm* — Alleman Hall Creasman & Tuttle LLP

(57) ABSTRACT

Examples are disclosed herein that relate to curved batteries. One example provides a battery comprising an anode arranged on an anode substrate, a cathode arranged on a cathode substrate, the anode substrate being curved at a first curvature and the cathode substrate being curved at a second curvature, and a separator between the anode and the cathode. A thickness of the anode substrate and a thickness of the cathode substrate are determined based on the curvature of the respective substrate, such that the one of the anode substrate and the cathode substrate with a larger curvature has a larger thickness.

36 Claims, 4 Drawing Sheets

(51) Int. Cl.
*H01M 2/16* (2006.01)
*H01M 2/18* (2006.01)
*H01M 6/02* (2006.01)
*H05K 5/00* (2006.01)
*G06F 1/16* (2006.01)
*H04M 1/02* (2006.01)
*H01M 4/02* (2006.01)

(52) U.S. Cl.
CPC ........... *H01M 2/1673* (2013.01); *H01M 2/18* (2013.01); *H01M 2/204* (2013.01); *H01M 6/02* (2013.01); *H04M 1/0262* (2013.01); *H05K 5/0017* (2013.01); *H05K 5/0086* (2013.01); *H01M 2004/021* (2013.01); *H01M 2220/30* (2013.01)

(58) Field of Classification Search
USPC ............. 455/572, 127.1, 127.4, 343.1, 343.6
See application file for complete search history.

(56) References Cited

U.S. PATENT DOCUMENTS

| | | | | |
|---|---|---|---|---|
| 5,172,256 A * | 12/1992 | Sethofer | ................. | A61F 9/023 349/116 |
| 5,300,165 A * | 4/1994 | Sugikawa | ............ | B22F 3/1118 156/150 |
| 5,526,846 A | 6/1996 | Maloberti | | |
| 5,556,722 A * | 9/1996 | Narukawa | ........... | H01M 2/0202 429/163 |
| 5,840,441 A | 11/1998 | Hirofumi et al. | | |
| 6,149,781 A * | 11/2000 | Forand | ..................... | C25F 1/00 204/239 |
| 6,329,097 B1 | 12/2001 | Kim | | |
| 6,435,689 B2 * | 8/2002 | Pitts | ........................ | F21L 4/022 362/208 |
| 6,672,513 B2 * | 1/2004 | Bard | .................. | G04B 37/0016 235/462.45 |
| 6,707,614 B2 * | 3/2004 | Tanaka | ............... | G02B 27/0961 257/E27.111 |
| 6,739,931 B2 * | 5/2004 | Yamazaki | ........... | H01L 27/3246 216/41 |
| 6,805,519 B1 * | 10/2004 | Courtney | ................. | B63C 9/08 405/185 |
| 6,877,216 B2 * | 4/2005 | Fukuda | ................ | B29C 47/062 29/730 |
| 6,879,096 B1 * | 4/2005 | Miyazaki | ............ | G09G 3/2011 313/292 |
| 6,946,218 B2 | 9/2005 | Crouch, Jr. et al. | | |
| 7,049,028 B2 * | 5/2006 | Notten | ................. | H01M 4/043 29/623.1 |
| 7,074,520 B2 * | 7/2006 | Probst | ................... | A61N 1/375 429/176 |
| 7,090,944 B2 * | 8/2006 | Urade | ................. | H01M 2/0421 429/171 |
| 7,103,415 B2 * | 9/2006 | Probst | ................... | A61N 1/375 607/36 |
| 7,157,850 B2 * | 1/2007 | Miyazaki | ............ | G09G 3/2011 313/292 |
| 7,163,762 B2 * | 1/2007 | Endo | ...................... | H01B 1/122 429/163 |
| 7,172,833 B2 * | 2/2007 | Urade | ................. | H01M 2/0421 429/174 |
| 7,323,814 B2 * | 1/2008 | Miyazaki | ............ | G09G 3/2011 313/495 |
| 7,483,001 B2 * | 1/2009 | Matsueda | ............ | H01L 27/124 345/76 |
| 7,486,498 B2 * | 2/2009 | Welsch | ................... | H01G 9/04 361/508 |
| 7,531,261 B2 * | 5/2009 | Badding | ............... | C04B 35/486 429/465 |
| 7,655,881 B2 * | 2/2010 | Tanaka | ................ | G02B 27/0961 219/121.65 |
| 7,687,196 B2 * | 3/2010 | Kumakiri | ................ | H01M 2/08 429/163 |
| 7,737,617 B2 * | 6/2010 | Miyazaki | ............ | G09G 3/2011 313/310 |
| 7,901,807 B2 * | 3/2011 | Honda | ................ | H01M 10/052 429/124 |
| 7,982,692 B2 * | 7/2011 | Matsueda | ............ | H01L 27/124 315/169.3 |
| 8,242,536 B2 * | 8/2012 | Tanabe | ................ | H01L 29/0615 257/140 |
| 8,277,967 B2 * | 10/2012 | Asari | ................... | H01G 9/0029 429/94 |
| 8,294,637 B2 * | 10/2012 | Matsueda | ............ | H01L 27/124 315/169.3 |
| 8,338,022 B2 * | 12/2012 | Fukui | .................. | H01M 4/0471 429/142 |
| 8,441,185 B2 * | 5/2013 | Kuwabara | ........... | H01L 27/3246 313/504 |
| 8,477,981 B2 * | 7/2013 | Heck | ....................... | G04G 21/06 381/333 |
| 8,507,132 B2 * | 8/2013 | Wakita | ................ | H01M 4/0404 429/188 |
| 8,525,760 B2 * | 9/2013 | Matsueda | ............ | H01L 27/124 315/169.3 |
| 8,530,067 B2 * | 9/2013 | Miyaki | ............... | H01M 4/0421 429/209 |
| 8,592,065 B2 | 11/2013 | Bhardwaj et al. | | |
| 8,691,425 B2 | 4/2014 | Yoon | | |
| 8,722,245 B2 * | 5/2014 | Hirose | .................. | H01M 4/134 429/218.1 |
| 8,802,261 B2 * | 8/2014 | Goh | .................... | H01M 2/0275 29/623.2 |
| 8,851,372 B2 * | 10/2014 | Zhou | ....................... | G06F 1/163 235/380 |
| 8,916,290 B2 | 12/2014 | Aamodt et al. | | |
| 8,932,757 B2 * | 1/2015 | Fujinaga | ............... | H01M 4/134 429/218.1 |
| 8,951,660 B2 | 2/2015 | Choo et al. | | |
| 8,974,936 B2 * | 3/2015 | Lee | .................... | H01M 2/0285 429/82 |
| 8,999,543 B2 * | 4/2015 | Cho | ........................ | H01M 4/13 429/176 |
| 9,005,789 B2 * | 4/2015 | Kim | ................... | H01M 10/0587 429/94 |
| 9,041,350 B2 | 5/2015 | Bang et al. | | |
| 9,048,483 B2 * | 6/2015 | Nakamura | .......... | H01M 2/1077 |
| 9,158,285 B2 * | 10/2015 | Vondle | .................. | G04G 17/08 |
| 9,203,079 B2 * | 12/2015 | Hirose | .................. | H01M 4/134 |
| 9,276,292 B1 * | 3/2016 | MacKenzie | ....... | H01M 10/0567 |
| 9,342,105 B2 * | 5/2016 | Choi | ...................... | G06F 1/1637 |
| 9,385,396 B2 * | 7/2016 | Goh | .................... | H01M 2/0275 |
| 9,476,702 B2 * | 10/2016 | Kim | ...................... | G01B 17/02 |
| 9,508,961 B2 * | 11/2016 | Hirakata | ................ | H01L 51/56 |
| 9,560,179 B2 * | 1/2017 | Lumbard | ............ | H04M 1/0279 |
| 9,594,402 B2 * | 3/2017 | Hiroki | ...................... | G06F 1/163 |
| 9,634,349 B2 * | 4/2017 | Hawtof | ............... | H01M 10/0436 |
| 9,639,119 B2 * | 5/2017 | Seok | ...................... | A61B 5/681 |
| 9,711,770 B2 * | 7/2017 | Anastas | ............... | H01M 2/1653 |
| 2001/0004318 A1 * | 6/2001 | Pitts | ........................ | F21L 4/022 362/84 |
| 2002/0074936 A1 * | 6/2002 | Yamazaki | ........... | H01L 27/3246 313/504 |
| 2002/0090549 A1 * | 7/2002 | Urade | ................. | H01M 2/0421 429/174 |
| 2002/0151775 A1 * | 10/2002 | Kondo | ................ | A61B 5/02438 600/344 |
| 2002/0160257 A1 * | 10/2002 | Lee | ........................ | H01M 6/46 429/130 |
| 2002/0160258 A1 * | 10/2002 | Lee | .................... | H01M 2/1686 429/130 |
| 2002/0191301 A1 * | 12/2002 | Tanaka | ............... | G02B 27/0961 359/668 |
| 2003/0013012 A1 * | 1/2003 | Ahn | ...................... | H01G 9/26 429/152 |
| 2003/0039883 A1 | 2/2003 | Notten et al. | | |
| 2003/0108787 A1 * | 6/2003 | Endo | ...................... | H01B 1/122 429/94 |

(56) References Cited

U.S. PATENT DOCUMENTS

| | | | | |
|---|---|---|---|---|
| 2003/0132896 A1* | 7/2003 | Matsueda | H01L 27/124 | 345/55 |
| 2003/0138693 A1* | 7/2003 | Suzuki | H01M 2/0222 | 429/162 |
| 2004/0029001 A1* | 2/2004 | Yamazaki | H01M 2/021 | 429/176 |
| 2004/0155019 A1* | 8/2004 | Tanaka | G02B 27/0961 | 219/121.82 |
| 2004/0197639 A1* | 10/2004 | Honda | H01M 10/052 | 429/94 |
| 2004/0202929 A1* | 10/2004 | Urade | H01M 2/0421 | 429/174 |
| 2004/0253506 A1* | 12/2004 | Urade | H01M 2/0421 | 429/56 |
| 2004/0253511 A1* | 12/2004 | Urade | H01M 2/0421 | 429/174 |
| 2005/0079406 A1* | 4/2005 | Daido | H01M 2/14 | 429/60 |
| 2005/0082963 A1* | 4/2005 | Miyazaki | G09G 3/2011 | 313/493 |
| 2005/0123829 A1* | 6/2005 | Fukui | H01M 4/0471 | 429/164 |
| 2005/0168919 A1* | 8/2005 | Welsch | H01G 9/042 | 361/525 |
| 2005/0227389 A1* | 10/2005 | Bhattacharya | H01L 51/0097 | 438/22 |
| 2006/0024578 A1* | 2/2006 | Lee | H01M 2/18 | 429/208 |
| 2006/0093910 A1* | 5/2006 | Yoon | H01M 10/0587 | 429/209 |
| 2006/0169989 A1* | 8/2006 | Bhattacharya | H01L 51/0021 | 257/79 |
| 2006/0216593 A1* | 9/2006 | Jung | H01M 2/06 | 429/178 |
| 2006/0222944 A1* | 10/2006 | Yamamoto | H01M 2/16 | 429/218.1 |
| 2006/0250333 A1* | 11/2006 | Matsueda | H01L 27/124 | 345/76 |
| 2006/0267887 A1* | 11/2006 | Matsueda | H01L 27/124 | 345/76 |
| 2007/0059595 A1* | 3/2007 | Endo | H01B 1/122 | 429/176 |
| 2007/0108886 A1* | 5/2007 | Miyazaki | G09G 3/2011 | 313/495 |
| 2007/0141452 A1* | 6/2007 | Kim | H01M 2/0202 | 429/120 |
| 2007/0173358 A1* | 7/2007 | Gallagher | A63B 69/0002 | 473/457 |
| 2007/0241201 A1* | 10/2007 | Brown | G06Q 20/26 | 235/493 |
| 2008/0002528 A1* | 1/2008 | Andren | G04G 17/045 | 368/241 |
| 2008/0079349 A1* | 4/2008 | Miyazaki | G09G 3/2011 | 313/495 |
| 2008/0241687 A1* | 10/2008 | Ishii | B60L 11/123 | 429/218.1 |
| 2008/0241705 A1* | 10/2008 | Wakita | H01M 4/0404 | 429/344 |
| 2009/0087731 A1* | 4/2009 | Fukui | H01M 4/131 | 429/164 |
| 2009/0169993 A1* | 7/2009 | Ohashi | H01G 9/151 | 429/209 |
| 2009/0311607 A1* | 12/2009 | Han | H01M 2/04 | 429/246 |
| 2010/0086837 A1* | 4/2010 | Asari | H01G 9/0029 | 429/94 |
| 2010/0117076 A1* | 5/2010 | Akimoto | H01L 29/66969 | 257/43 |
| 2010/0117086 A1* | 5/2010 | Akimoto | H01L 29/7869 | 257/57 |
| 2010/0136434 A1 | 6/2010 | Hanafusa | | |
| 2010/0187567 A1* | 7/2010 | Tanabe | H01L 29/0615 | 257/140 |
| 2010/0310924 A1* | 12/2010 | Kaneda | H01M 4/13 | 429/163 |
| 2010/0328075 A1* | 12/2010 | Rahamim | A61B 5/1135 | 340/573.1 |
| 2011/0007468 A1* | 1/2011 | Burton | G04F 10/00 | 361/679.03 |
| 2011/0037068 A1* | 2/2011 | Yamazaki | H01L 27/1225 | 257/43 |
| 2011/0042692 A1* | 2/2011 | Matsueda | H01L 27/124 | 257/88 |
| 2011/0070471 A1* | 3/2011 | Cho | H01M 4/13 | 429/94 |
| 2011/0097615 A1* | 4/2011 | Goh | H01M 2/0275 | 429/94 |
| 2011/0111277 A1* | 5/2011 | Bessho | H01M 4/0404 | 429/94 |
| 2011/0151296 A1* | 6/2011 | Muraoka | H01M 4/13 | 429/94 |
| 2011/0192623 A1* | 8/2011 | Fujinaga | H01M 4/134 | 173/217 |
| 2011/0217591 A1* | 9/2011 | Heo | H01M 2/204 | 429/211 |
| 2011/0274974 A1* | 11/2011 | Sabi | H01M 2/0212 | 429/220 |
| 2011/0287288 A1* | 11/2011 | Hina | H01M 4/1391 | 429/94 |
| 2012/0115071 A1* | 5/2012 | Fleury | C25B 9/06 | 429/523 |
| 2012/0229882 A1* | 9/2012 | Fish, Jr. | B60R 1/025 | 359/267 |
| 2013/0017425 A1* | 1/2013 | Watanabe | H01M 2/1673 | 429/94 |
| 2013/0108907 A1* | 5/2013 | Bhardwaj | H01M 10/0431 | 429/94 |
| 2013/0108912 A1 | 5/2013 | Quek et al. | | |
| 2013/0108927 A1* | 5/2013 | Wang | H01M 4/625 | 429/231.1 |
| 2013/0136967 A1* | 5/2013 | Bhardwaj | H01M 10/0431 | 429/94 |
| 2013/0216907 A1* | 8/2013 | Rayner | B22F 9/04 | 429/211 |
| 2013/0226486 A1* | 8/2013 | Henderson | G01R 31/3606 | 702/63 |
| 2013/0262067 A1* | 10/2013 | Zhang | G05B 23/0283 | 703/8 |
| 2013/0295431 A1* | 11/2013 | Kwon | H01M 2/0275 | 429/127 |
| 2013/0329532 A1* | 12/2013 | Sorias | G04C 10/00 | 368/64 |
| 2014/0014420 A1* | 1/2014 | Nakamura | H01M 2/1077 | 180/65.1 |
| 2014/0014702 A1* | 1/2014 | Yuhara | H01M 4/04 | 226/88 |
| 2014/0027793 A1* | 1/2014 | Matsueda | H01L 27/124 | 257/88 |
| 2014/0045283 A1* | 2/2014 | Hirakata | H01L 51/56 | 438/22 |
| 2014/0057046 A1* | 2/2014 | Wu | H01M 4/0423 | 427/113 |
| 2014/0065457 A1* | 3/2014 | Bhardwaj | H01M 4/70 | 429/94 |
| 2014/0109397 A1* | 4/2014 | Devan | H01M 10/049 | 29/623.2 |
| 2014/0147731 A1* | 5/2014 | Anastas | H01M 2/1653 | 429/163 |
| 2014/0154566 A1* | 6/2014 | Hirose | H01M 4/134 | 429/211 |
| 2014/0201982 A1* | 7/2014 | Waseda | H01M 10/0525 | 29/623.1 |
| 2014/0215810 A1* | 8/2014 | Kim | H01M 10/0587 | 29/623.5 |
| 2014/0239065 A1* | 8/2014 | Zhou | G06F 1/163 | 235/380 |

(56) References Cited

U.S. PATENT DOCUMENTS

| | | | |
|---|---|---|---|
| 2014/0318696 A1* | 10/2014 | Yamaue | H01M 8/1004 156/230 |
| 2015/0010813 A1 | 1/2015 | Ko et al. | |
| 2015/0026969 A1 | 1/2015 | Yasooka et al. | |
| 2015/0049591 A1* | 2/2015 | Adams | G04G 21/08 368/13 |
| 2015/0111088 A1* | 4/2015 | Hiroki | H01M 10/0436 429/149 |
| 2015/0118533 A1* | 4/2015 | Yi | H01M 2/0404 429/94 |
| 2015/0138699 A1* | 5/2015 | Yamazaki | G06F 1/163 361/679.03 |
| 2015/0140371 A1* | 5/2015 | Slocum | H01M 2/02 429/56 |
| 2015/0153862 A1* | 6/2015 | Nakamura | G06F 3/041 345/173 |
| 2015/0162517 A1* | 6/2015 | Kasichainula | H01L 35/32 136/211 |
| 2015/0188185 A1 | 7/2015 | Taylor et al. | |
| 2015/0192903 A1* | 7/2015 | Vondle | G04G 17/08 368/317 |
| 2015/0207143 A1* | 7/2015 | Wu | H01M 4/366 429/231.8 |
| 2015/0228933 A1* | 8/2015 | Seong | H01M 2/0202 429/178 |
| 2015/0236167 A1* | 8/2015 | Yamazaki | H01L 29/7869 257/43 |
| 2015/0241916 A1* | 8/2015 | Choi | G06F 1/163 361/679.03 |
| 2015/0241917 A1* | 8/2015 | Seok | A61B 5/681 361/679.03 |
| 2015/0253487 A1* | 9/2015 | Nichol | G02B 6/0036 362/610 |
| 2015/0261254 A1* | 9/2015 | Hiroki | G06F 1/163 361/679.03 |
| 2015/0263318 A1* | 9/2015 | Suzuki | H01M 2/1016 307/10.1 |
| 2015/0288023 A1* | 10/2015 | Andry | C25D 1/04 429/127 |
| 2015/0288024 A1* | 10/2015 | Andry | C25D 1/04 429/127 |
| 2015/0303413 A1 | 10/2015 | Yun | |
| 2015/0325820 A1* | 11/2015 | Sohn | H01M 2/0404 429/127 |
| 2015/0333299 A1 | 11/2015 | Tsai et al. | |
| 2015/0349375 A1 | 12/2015 | Takahashi et al. | |
| 2016/0028081 A1* | 1/2016 | Zhang | C01G 45/1221 429/231.1 |
| 2016/0034742 A1* | 2/2016 | Kim | H04B 1/385 382/124 |
| 2016/0043354 A1* | 2/2016 | Han | H01M 2/0202 429/185 |
| 2016/0066859 A1* | 3/2016 | Crawford | A61B 5/7264 600/301 |
| 2016/0078061 A1* | 3/2016 | Hilsdale | G06F 19/322 707/687 |
| 2016/0079571 A1 | 3/2016 | Seong | |
| 2016/0095172 A1* | 3/2016 | Lee | C23C 16/401 313/504 |
| 2016/0133985 A1* | 5/2016 | Harayama | H01M 2/0217 429/94 |
| 2016/0134732 A1* | 5/2016 | Lumbard | H04M 1/0279 455/575.3 |
| 2016/0218387 A1* | 7/2016 | Tajima | H01M 10/0431 |
| 2016/0226035 A1* | 8/2016 | Cho | H01M 2/105 |
| 2016/0226055 A1* | 8/2016 | Miyake | H01M 2/06 |
| 2016/0254569 A1* | 9/2016 | Yagi | H01M 2/1077 429/94 |
| 2016/0265125 A1* | 9/2016 | Yokoyama | A61B 6/00 |
| 2016/0276636 A1* | 9/2016 | Kim | H01M 2/0202 |
| 2016/0301095 A1* | 10/2016 | Hawtof | H01M 10/0436 |
| 2016/0359341 A1* | 12/2016 | Huang | H02J 7/0054 |
| 2016/0360817 A1* | 12/2016 | Lombard | F21V 33/0008 |
| 2017/0011210 A1* | 1/2017 | Cheong | H04W 12/06 |
| 2017/0033326 A1* | 2/2017 | Goto | H01M 2/0275 |
| 2017/0054125 A1* | 2/2017 | Shaffer, II | H01M 10/0418 |
| 2017/0069867 A1* | 3/2017 | Hirakata | H01L 51/56 |
| 2017/0077490 A1* | 3/2017 | Zhang | C01G 45/1221 |
| 2017/0083046 A1* | 3/2017 | Seok | A61B 5/681 |
| 2017/0090512 A1* | 3/2017 | Seok | A61B 5/681 |
| 2017/0177025 A1* | 6/2017 | Hiroki | G06F 1/163 |

FOREIGN PATENT DOCUMENTS

| | | |
|---|---|---|
| WO | 2014056111 A1 | 4/2014 |
| WO | 2015016463 A1 | 2/2015 |
| WO | 2015105304 A1 | 7/2015 |

OTHER PUBLICATIONS

"Wearable Device", Published on: Mar. 26, 2016 Available at: http://www.samsungsdi.com/lithium-ion-battery/it-devices/wearable-device.html.

Ozawa, Kazunori, "Lithium Ion Rechargeable Batteries: Materials, Technology, and New Applications", Section 2.5.2. In Publication of Wiley-VCH, Nov. 23, 2009, 2 pages.

"International Search Report and Written Opinion Issued in PCT Application No. PCT/US2017/047873", dated Oct. 16, 2017, 14 Pages.

* cited by examiner

VARIABLE LAYER THICKNESS IN CURVED BATTERY CELL

BACKGROUND

A typical portable electronic device utilizes a battery to enable operation without being connected to a mains power source. A battery may be adapted to the housing of a portable electronic device to achieve a desired packaging size and/or form factor of the portable electronic device.

SUMMARY

Examples are disclosed herein that relate to curved batteries. One example provides a battery comprising an anode arranged on an anode substrate, a cathode arranged on a cathode substrate, the anode substrate being curved at a first curvature and the cathode substrate being curved at a second curvature, and a separator between the anode and the cathode. A thickness of the anode substrate and a thickness of the cathode substrate are determined based on the curvature of the respective substrate, such that the one of the anode substrate and the cathode substrate with a larger curvature has a larger thickness.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

As described above, a typical portable electronic device utilizes a battery to enable operation without being connected to a mains power source. To achieve a desired packaging size and/or form factor of the portable electronic device, the battery may be adapted to the housing of the portable electronic device. For example, the size of the battery may be limited to accommodate a packaging size of the portable electronic device. Alternatively or additionally, the geometry of the battery may be configured to accommodate the form factor of the portable electronic device, which in some implementations may assume curved forms such as those of a curved smartphone or curved smartwatch.

Manufacturing processes for a battery configured for portable electronic devices that have curved form factors may attempt to curve the battery. Following an electrode forming and stacking process for curved electrode layers in such a battery, however, the material in the electrode layers may exhibit resilience and at least partially return to an initial shape (e.g., return to a planar shape from before curving). Such resilience may be the result of residual stress and/or strain in the electrode material that has accumulated during curving of the planar layers, for example, which release over time, in turn causing the overall battery that includes the electrode material to deflect and lose curvature and return to a more planar form. Deflection of the battery may compete with the form factor of the portable electronic device for which the battery was configured by for example contacting the housing of the device, potentially resulting in degraded operation of the battery and/or portable electronic device.

Accordingly, examples are disclosed that relate to batteries and a battery manufacturing method. As described in further detail below, a battery may comprise an anode arranged on an anode substrate, a cathode arranged on a cathode substrate, the anode substrate being curved at a first curvature and the cathode substrate being curved at a second curvature, and a separator between the anode and the cathode. A thickness of the anode substrate and a thickness of the cathode substrate may be determined based on the curvature of the respective substrate, such that the one of the anode substrate and the cathode substrate with a larger curvature has a larger thickness.

Figure 1A:
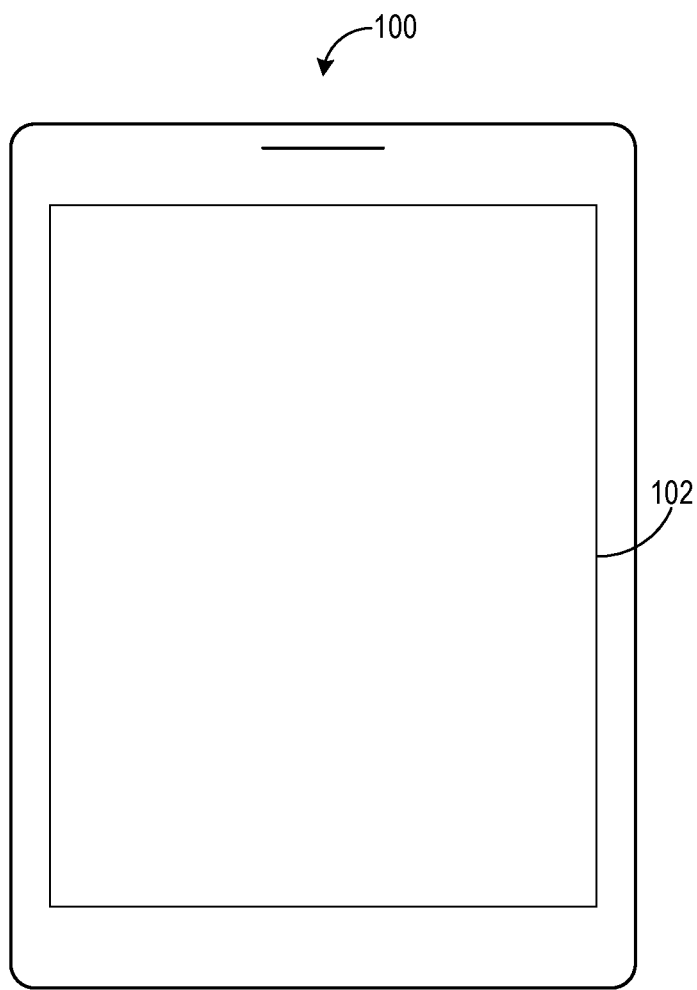
FIGS. 1A-B respectively show a front view and a side view of an example portable electronic device.

FIG. 1A shows a front view of a portable electronic device 100. Device 100 is shown in the form of a smartphone, but may assume any other suitable form, including but not limited to that of a tablet computing device, laptop computing device, wearable electronic device, etc. Device 100 includes a display 102 and suitable computing device hardware (e.g., processor, memory) not shown in FIG. 1A for performing various computing device functions, such as controlling display output based on user input (e.g., received via a touchscreen of the portable electronic device and/or via another suitable mechanism).

Figure 1B:
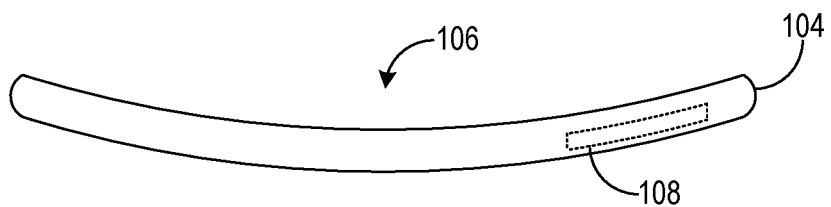

As shown in FIG. 1B, which shows a side view of portable electronic device 100, the portable electronic device includes a curved form factor. In particular, device 100 includes a housing 104 having a curved portion 106, whose curved geometry may be accommodated by various curved components arranged therein. To this end, display 102 may be curved, as well as a battery 108 arranged in curved portion 106 and electrically coupled to the display and/or other potential components for enabling portable, powered operation of device 100. As described in further detail below, battery 108 may include two or more cells that are coupled together (e.g., in parallel or in series) to increase the voltage and/or current provided to device 100. The thickness of each cell may fall within various suitable ranges, such as between 5 and 40 μm, or more particularly between 10 and 20 μm. With the thickness of each cell being between 10 and 20 μm, for example, the total thickness of two cells integrated in battery 108 may be between 20 and 40 μm, the total thickness of three cells may be between 30 and 60 μm, the total thickness of four cells may be between 40 and 80 μm, and so on. Regardless of the number of cells included therein, battery 108 may support a thin and compact form factor of device 100. Further, battery 108 may be replaceable and/or rechargeable.

Figure 2:
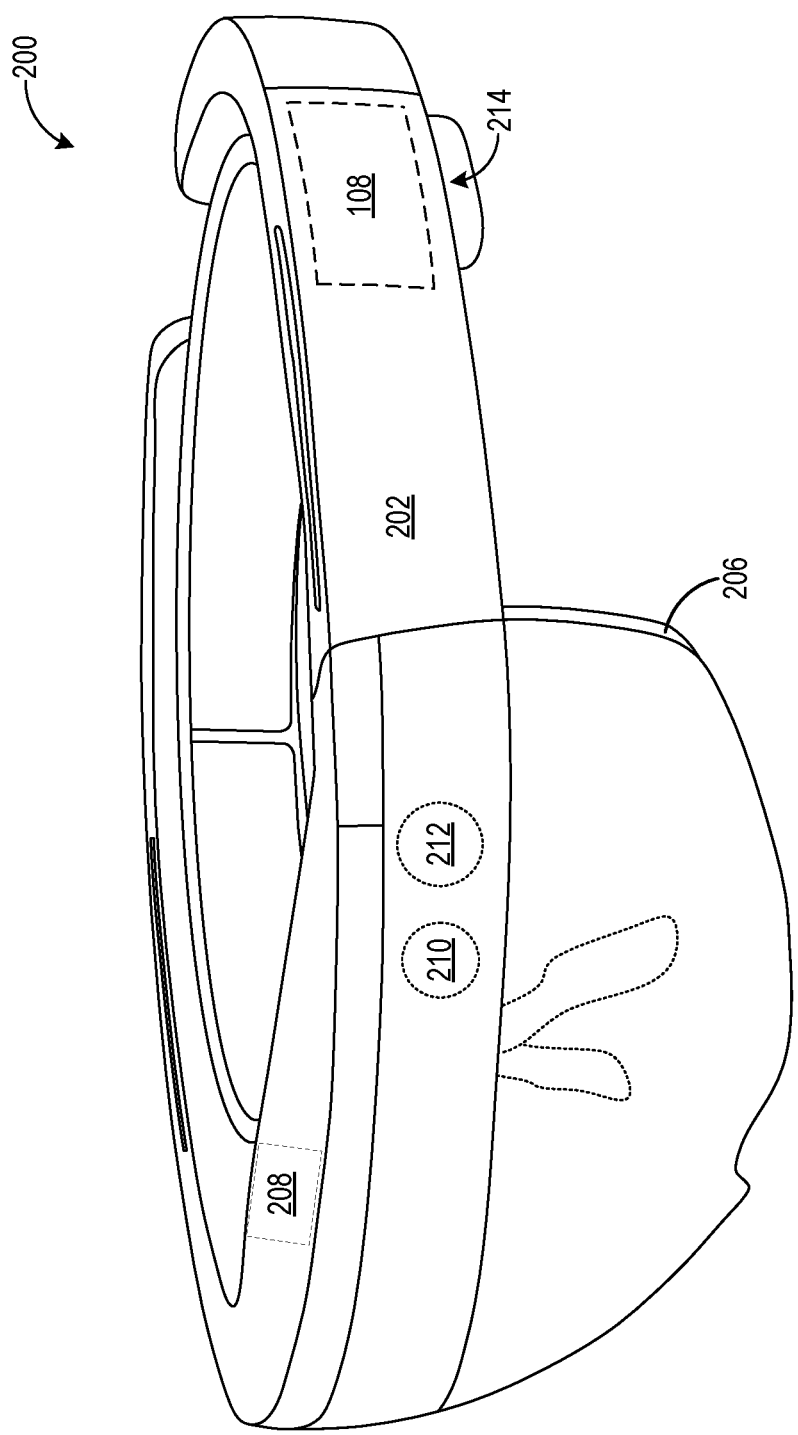
FIG. 2 shows an example portable electronic device in the form of a head-mounted display device.

Battery 108 may accommodate curved form factors of other portable electronic devices. As another example, FIG. 2 shows a portable electronic device in the form of a head-mounted display (HMD) device 200. HMD device 200 includes a frame 202 comprising a band wearable around a head of wearer, wherein the frame supports see-through display componentry positioned nearby the wearer's eyes. HMD device 100 may utilize augmented reality technologies to enable simultaneous viewing of virtual display imagery and a real world background. As such, HMD device 200 may generate virtual images via a see-through display system including a see-through veil 206. A controller 208 is operatively coupled to the see-through display system and to other display componentry. Controller 208 includes one or more logic devices and one or more storage devices holding instructions executable by the logic device(s) to enact various functionalities of HMD device 200. HMD device 200 may further include other components, for example a two-dimensional image camera 210 (e.g. a visible light camera and/or infrared camera) and a depth camera 212, as well as other potential components not shown in FIG. 2, including but not limited to speakers, microphones, accelerometers, gyroscopes, magnetometers, temperature sensors, touch sensors, biometric sensors, other image sensors, eye-gaze detection systems, a communication facility, and a GPS receiver.

FIG. 2 shows battery 108 arranged in a curved portion 214 of frame 202 for enabling portable, powered operation of HMD device 200. The curved geometry of battery 108 accommodates the curved portion 214 such that the curved portion can receive the battery 108 without sacrificing a desired packaging size, compact form factor, wearability, and aesthetic quality of HMD device 200. As described above, battery 108 may include two or more cells to increase the voltage and/or current provided to HMD device 200, and may be replaceable and/or rechargeable. Further, while not shown in FIG. 2, two or more batteries 108 may be included in HMD device 200 (e.g., at other curved portions of frame 202). Still further, battery 108 may be included in other devices, such as those which include housings having curved and planar portions (e.g., smartwatch).

Figure 3:
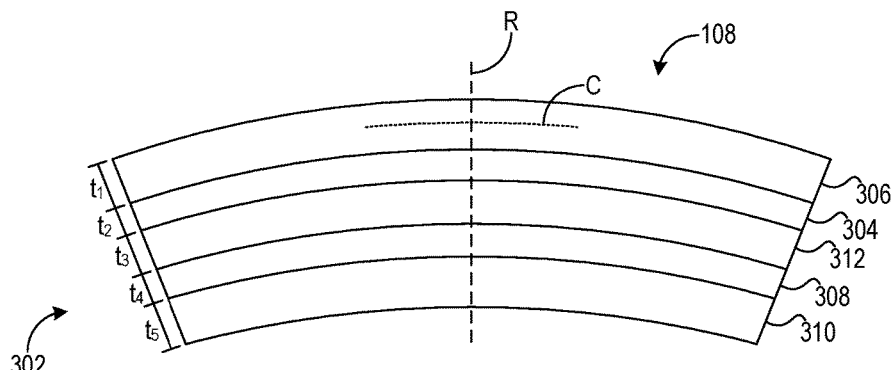
FIG. 3 shows a cross-sectional view of an example battery.

FIG. 3 is a cross-sectional view of battery 108. As shown therein, battery 108 includes various curved layers 302, which are formed in a process that reduces residual stress and/or strain and therefore enables the curved geometry of the layers to be retained when installed in a device, reducing their tendency to deform toward an initial (e.g., planar) shape. An example method of manufacturing a battery according to the approaches described herein is described below with reference to FIG. 5.

Layers 302 include an anode 304 arranged on an anode substrate 306, a cathode 308 arranged on a cathode substrate 310, and a separator 312 between the anode and cathode for electrically isolating the anode and the cathode. As examples, anode 304 may be comprised of a graphite composite mixed with other chemical(s) forming a paste that is coated on anode substrate 306, which may be comprised of copper (e.g., copper foil). A thickness of anode substrate 306—e.g., as measured along a radial direction R—may be between 2 and 18 μm, or may be 12 μm, for example. Cathode 308 may be comprised of lithium cobalt oxide ($LiCoO_2$) in a paste form that is coated on cathode substrate 310, which may be comprised of aluminum (e.g., aluminum foil). Other suitable materials can alternatively be used. A thickness of cathode substrate 310—e.g., as measured along radial direction R—may be between 4 and 26 μm, or between 22 and 26 μm, or may be 24 μm, for example. Separator 312 may be comprised of polyethylene and/or polypropylene—e.g., as a layer that is coated on both sides with aluminum oxide.

The thickness of each layer 302 may be determined by the curvature of that layer. More particularly, a layer 302 with a larger curvature relative to another layer may have a larger thickness than the other layer. To this end, FIG. 2 shows anode substrate 306 curved at a first curvature, and cathode substrate 310 curved at a second curvature, with the second curvature being greater than the first curvature. In this arrangement, anode substrate 306 may have a greater radius of curvature than that of cathode substrate 310, which may share a common center of curvature with the anode substrate and may be separated from the center of curvature by a radial distance $R_2$ (not shown in FIG. 3) that is smaller than a radial distance $R_1$ (not shown in FIG. 3) by which the anode substrate 306 is separated from the center of curvature. Implementations are contemplated, however, in which the first curvature of anode substrate 306 is greater than the second curvature of cathode substrate 310. Generally, as each layer 302 is imbued with greater curvature, the thickness of that layer increases. As such, the ratio of the thickness of a given layer 302 to the curvature of that layer may remain substantially constant throughout variation of the thickness and curvature of that layer. Further, while FIG. 3 depicts an example in which the thickness of each layer 302 remains substantially constant throughout the cross-section of battery 108—e.g., as measured along a circumferential direction C—implementations are possible in which the thickness of one or more of the layers varies along the circumferential direction C—for example, to support tapered device housings. A layer with a variable thickness along the circumferential direction C may be thicker or thinner toward its middle relative to its ends, or may exhibit any other suitable type of thickness variance.

The thickness of one layer 302 may differ from the thickness of another layer. In one example, unequal layer thicknesses may be a result of the manufacturing process of battery 108, and particularly portions thereof in which layers 302 are elongated in curved fashion. In this example, layers 302 initially may be of substantially equal length and/or thickness (e.g., and may be planar). Following elongation, layers 302 more radially outward may be longer than layers more radially inward—e.g., as shown in FIG. 3, the arc length of anode substrate 306 along circumferential direction C is greater than the arc length of cathode substrate 310 along the circumferential direction. Being elongated to a relatively greater degree than cathode substrate 310, the thickness of anode substrate 306 may be less than the thickness of the cathode substrate. Consequently, the thickness of anode 304 may be less than the thickness of cathode 308.

FIG. 3 shows thicknesses $t_1$, $t_2$, $t_3$, $t_4$, and $t_5$ of layers 306, 304, 312, 308, and 310, respectively. One or more of the thicknesses $t_1$-$t_5$ may be substantially equal, including in some examples all of the thicknesses, or in other examples each thickness may be different from the other thicknesses. In the example shown in FIG. 3, thicknesses $t_1$ and $t_5$ differ from each other, and thicknesses $t_2$ and $t_4$ differ from thicknesses $t_1$, $t_3$, and $t_5$. Thicknesses $t_2$ and $t_4$ may be substantially equal, for example.

Unequal thicknesses between or among layers 302 may support desired material and/or mechanical properties of the layers and battery 108. More specifically, one or more layers 302 may be imbued with different thicknesses to accommodate different kinds of stress and/or strain. For example, layers 302 more radially outward, such as anode substrate 306, may be relatively thinner than one or more layers more radially inward so that the layers more radially outward can withstand elongation without degradation. As another example, layers 302 more radially inward, such as cathode substrate 310, may exhibit a greater degree of strain relative to one or more layers more radially outward, and may stiffen after compression (e.g., as part of curving battery 108), thereby reducing the tendency of these layers to return to an initial (e.g., planar) shape prior to curvature.

Figure 4:
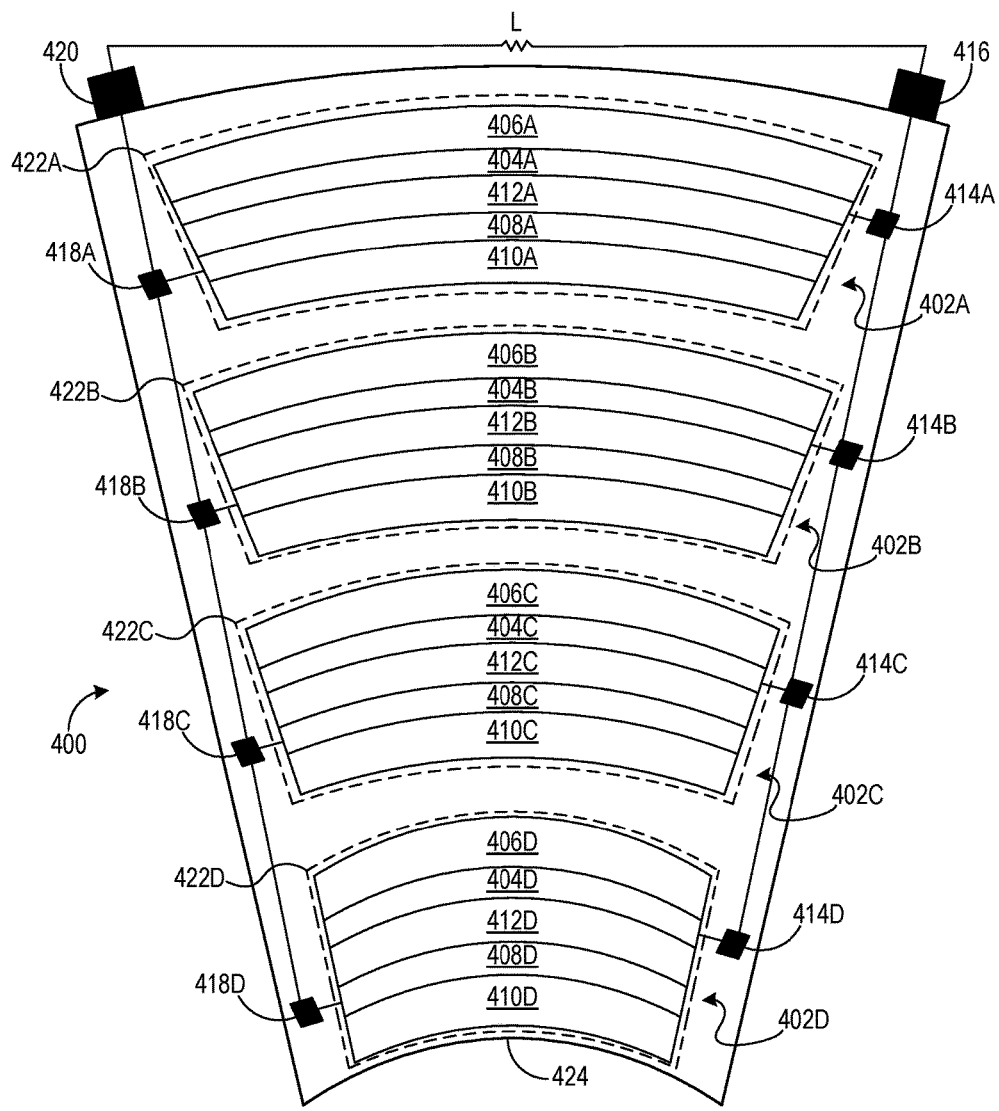
FIG. 4 shows a cross-sectional view of an example battery comprising four cells.

As described above, a battery manufactured according to the approaches described herein may include two or more cells that are coupled in series or in parallel. FIG. 4 shows a cross-sectional view of a battery 400 comprising four cells 402 that are connected in parallel. One or more of cells 402 may be battery 108, for example. Battery 400 includes a plurality of anodes 404 each arranged on a respective anode substrate 406, a plurality cathodes 408 each arranged on a respective cathode substrate 410, and a plurality of separators 412 each arranged between a respective anode-cathode pair. Battery 400 further includes a plurality of anode tabs 414 that are each coupled to a respective anode 404 of a corresponding cell 402. Each anode tab 414 may function as an anode terminal for its corresponding cell 402, and may be coupled together with the other anode tabs to form a battery anode tab 416 of battery 400. Similarly, battery 400 also includes a plurality of cathode tabs 418 each coupled to a respective cathode 408 of a corresponding cell 402. Each cathode tab 418 may function as a cathode terminal for its corresponding cell 402, and may be coupled together with the other cathode tabs to form a battery cathode tab 420 of battery 400.

With the configuration illustrated in FIG. 4, cells 402 may be connected in parallel or series to provide common anode and cathode tabs 416 and 420 of battery 400, which may be connected to a load to thereby form a powered circuit. FIG. 4 schematically depicts the connection of a load L to battery anode and cathode tabs 416 and 420, and may represent one or more components of portable electronic device 100 of FIG. 1, HMD device 200 of FIG. 2, or any other suitable components of a device to which power supply is desired. While shown as contacts, battery anode and cathode tabs 416 and 420 may assume any suitable form and may be arranged at any suitable location at battery 400.

While anodes 404 of cells 402, and cathodes 408 of the cells, may be coupled together as described above, other portions of a cell may be physically and/or electrically isolated from those of another cell. To this end, FIG. 4 shows the inclusion of a respective insulator 422 for each cell 402. Insulators 422 may be implemented in various suitable manners. As one example, a housing 424, which may at least partially enclose cells 402, may include an internal polypropylene coating on metal. As another example, cells 402 may be rolled onto polypropylene and then inserted in housing 424.

Housing 424 may be formed according to various suitable processes. As one example, housing 424 may be initially formed as a rectangular housing that is subsequently deformed to achieve a curved shape. As shown in FIG. 4, housing 424 may have a tapered shape to accommodate the lower widths of cells 402 positioned more radially inward (e.g., toward the bottom of FIG. 4) without wasting space. As other examples, housing 424 may be perforated, stamped, or formed of two or more initially separate pieces that are then joined together in a suitable process such as welding.

The thickness of each cell 402 may be determined by the curvature of that cell, and both the thickness and curvature of the cells may increase as battery 400 is traversed radially inward. For example, the thickness of cell 402D, which is farther radially inward than cell 402C, may be greater than the thickness of cell 402C. Further, the curvature of cell 402D may be greater than the curvature of cell 402C. As a result, the thickness of a given layer in a cell 402 may differ from the thickness of the corresponding layer in another cell. For example, the thickness of separator 412D may be greater than the thicknesses of separators 412A-C. The thickness of separators 412 may rise as the separators are increasingly curved, though thicker separators may be provided to accommodate thicker electrode pastes, for example.

As an example, the thickness of cathode substrate 410A may be 10 μm, the thickness of cathode substrate 410B may be 11 μm, the thickness of cathode substrate 410C may be 12 μm, and the thickness of cathode substrate 410D may be 14 μm. The rate of thickness increase with increasing curvature may be constant or may increase, and may be linear or non-linear. As a further example, the radius of curvature (e.g., average radius of curvature or radius of curvature at a radially intermediate cell position) of cell 402A may be 200 mm, the radius of curvature of cell 402B may be 175 mm, the radius of curvature of cell 402C may be 150 mm, and the radius of curvature of cell 402D may be 100 mm. Accordingly, the curvature of cell 402D may be $\frac{1}{100}$ mm, the curvature of cell 402C may be $\frac{1}{150}$ mm, the curvature of cell 402B may be $\frac{1}{175}$ mm, and the curvature of cell 402A may be $\frac{1}{200}$ mm. Thus, it will be appreciated that substrates with a larger curvature may have a greater thickness. In this example, adjacent cells 402 may be separated by a varying amount of distance with the greater separation toward the edge of the cells. The rate of radius of curvature increase may be constant or may increase, and may be linear or non-linear.

As another example, the thickness of cell 402A may be 5 mm, the thickness of cell 402B may be 5.5 mm, the thickness of cell 402C may be 6 mm, and the thickness of cell 402D may be 7 mm. In this example, the radius of curvature of cell 402A may be 400 mm, the radius of curvature of cell 402B may be 350 mm, the radius of curvature of cell 402C may be 300 mm, and the radius of curvature of cell 402D may be 200 mm. In this example also, it will be appreciated that cells with a larger curvature (i.e., smaller radius of curvature) have a greater thickness. In this example, adjacent cells 402 may be separated by a varying amount of distance with the greater separation toward the edge of the cells. It will be appreciated that these particular thicknesses and curvatures are presented as mere examples, and numerous other thickness values may be adopted that vary the thickness of the cells so that cells with a higher (larger) curvature are made to be thicker than cells with lower (smaller) curvatures.

While in some implementations total thickness may vary among cells, and potentially among corresponding layers across different cells, curvature-thickness ratios of layers across different cells may be substantially equal. For example, the ratio of the curvature of an anode of a first anode-cathode pair (e.g., anode 404A of cell 402A) to the thickness of a corresponding first anode substrate (e.g., anode substrate 406A of cell 402A) may be substantially equal to the ratio of the curvature of an anode of a second anode-cathode pair (e.g., anode 404B of cell 402B) to the thickness of a corresponding second anode substrate (e.g., anode substrate 406B of cell 402B). Similarly, the ratio of the curvature of a cathode of a first anode-cathode pair (e.g., cathode 408A of cell 402A) to the thickness of a corresponding first cathode substrate (e.g., cathode substrate 410A of cell 402A) may be substantially equal to the ratio of the curvature of a cathode of a second anode-cathode pair (e.g., cathode 408B of cell 402B) to the thickness of a corresponding second cathode substrate (e.g., cathode substrate 410B of cell 402B). In some examples, analogous substantially equal ratios may be exhibited for other layers in cells 402.

Various modifications to battery 400 are contemplated. For example, cells 402 may be connected in series, alternatively or in addition to being connected in parallel. Further, the inclusion of four cells 402 shown in FIG. 4 is provided as an example, and any suitable number of cells may be used to implement battery 400.

Figure 5:
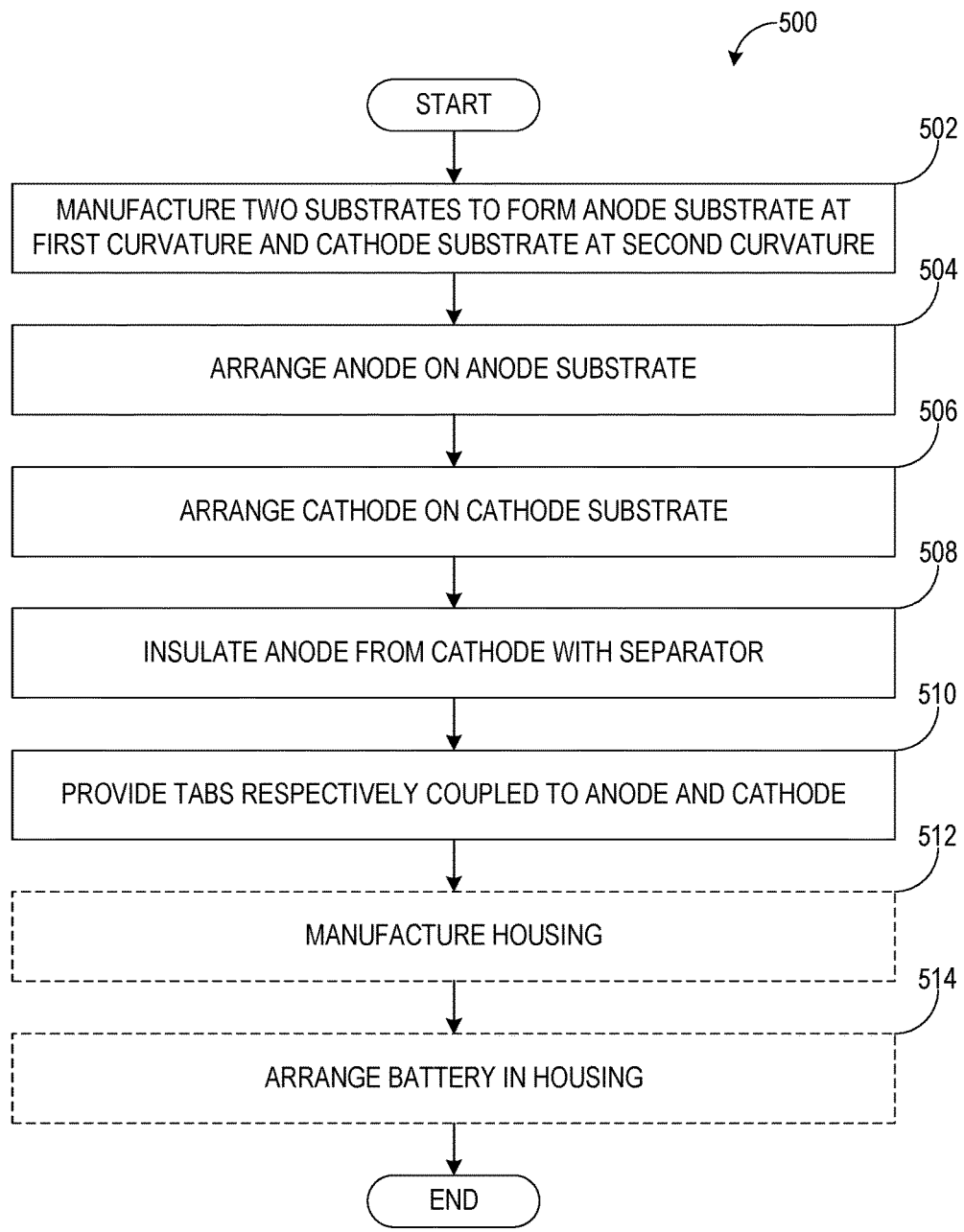
FIG. 5 shows a flowchart illustrating a method of manufacturing a battery.

FIG. 5 shows a flowchart illustrating a method 500 of manufacturing a battery. Method 500 may be used to manufacture batteries 108 (FIG. 3) and/or 400 (FIG. 4), for example.

At 502, method 500 includes manufacturing two substrates to form an anode substrate and a cathode substrate. The anode substrate may be anode substrate 306, and the cathode substrate may be cathode substrate 310, both of FIG. 3, for example. The anode substrate may be curved at a first curvature, and the cathode substrate may be curved at a second curvature. The one of the anode substrate and the cathode substrate with the larger curvature may have the larger thickness. For example, the first curvature may be greater than the second curvature, in which case the anode substrate may have a greater thickness than the cathode substrate. Alternatively, the second curvature may be greater than the first curvature, in which case the cathode substrate may have a greater thickness than the anode substrate. The thickness of the anode substrate may be between 2 and 18 µm, and the thickness of the cathode substrate may be between 4 and 26 µm, for example. The anode substrate may be comprised of copper or nickel (e.g., copper or nickel foil), and the cathode substrate may be comprised of aluminum (e.g., aluminum foil).

In some examples, manufacturing the two substrates may include annealing the two substrates. As the grade of the substrate materials, and the working conditions associated with annealing the substrates, may affect their tensile strength, these parameters may be selected to achieve a desired tensile strength of the substrate materials. To increase the residual strength of the substrate materials, cold rolled foil may be used, or the substrate materials thicknesses may be increased. The annealing process may be implemented in various suitable manners and may include applying relatively high temperatures to the substrate materials, quenching the substrate materials, and preventing the substrate materials from returning to an initial (e.g., planar) shape, for example.

At 504, method 500 includes arranging an anode on the anode substrate. The anode may be anode 304 of FIG. 3, for example. Anode arrangement may include coating the anode substrate with the anode, which in some examples may be a paste comprising a graphite composite mixed with other chemicals. In some examples, anode arrangement may include curing the anode paste.

At 506, method 500 includes arranging a cathode on the cathode substrate. The cathode may be cathode 308 of FIG. 3, for example. Cathode arrangement may include coating the cathode substrate with the cathode, which in some examples may be a paste comprising LCO. In some examples, cathode arrangement may include curing the cathode paste.

At 508, method 500 includes insulating the anode from the cathode with a separator. The separator may be separator 312 of FIG. 3, for example. The separator may be a composite of various layers with polyethylene coated on both sides with aluminum oxide.

At 510, method 500 includes providing tabs respectively coupled to the anode and the cathode. For example, one of anode tabs 414A-D may be coupled to the anode, and one of cathode tabs 418A-D may be coupled to the cathode, both of FIG. 4.

In some examples, the battery may be one of a plurality of cells manufactured according to method 500. In this case, method 500 may further comprise coupling together each of the tabs coupled to the anode of a respective cell to form a battery anode tab, and coupling together each of the tabs coupled to the cathode of a respective cell to form a battery cathode tab. The battery anode tab may be battery anode tab 416, and the battery cathode tab may be battery cathode tab 420, both of FIG. 4, for example. In other examples, the cathode tab of one cell may be coupled to the anode tab of another cell to implement a series cell configuration.

A thickness of a first cell formed of a first anode-cathode pair, a first anode substrate, a first cathode substrate, and a first separator may be greater than a thickness of a second cell formed of a second anode-cathode pair, a second anode substrate, a second cathode substrate, and a second separator, a curvature of the first cell being greater than a curvature of the second cell. The first cell may be relatively more radially inward than the second cell—e.g., the first cell and the second cell may be displaced from a common center of curvature by radii $R_1$ and $R_2$, respectively. The thicknesses of one or more of the layers may differ between the first and second cells, such as the separator thicknesses. The thicknesses of the first and second cells may be substantially constant throughout a cross-section (e.g., in a circumferential direction) or may vary. A ratio of a curvature of an anode of a first anode-cathode pair to a thickness of a first anode substrate may be substantially equal to a ratio of a curvature of an anode of a second anode-cathode pair to a thickness of a second anode substrate, and a ratio of a curvature of a cathode of the first anode-cathode pair to a thickness of a first cathode substrate may be substantially equal to a ratio of a curvature of a cathode of the second anode-cathode pair to a thickness of a second cathode substrate.

At 512, method 500 may optionally include manufacturing a housing for the battery. The housing may be housing 424 of FIG. 4, for example. The housing may be formed in any suitable manner, which may include deforming a rectangular container to obtain a curved shape, stamping the housing, separately forming two or more portions of the housing and joining the portions together (e.g., via welding). The housing may have a tapered shape (e.g., narrower at a bottom than a top of the housing).

At 514, method 500 may optionally include arranging the battery in the housing.

The following paragraphs provide additional support for the claims of the subject application. One aspect of the present disclosure provides a battery comprising an anode arranged on an anode substrate, a cathode arranged on a cathode substrate, the anode substrate being curved at a first curvature and the cathode substrate being curved at a second curvature, and a separator between the anode and the cathode, wherein a thickness of the anode substrate and a thickness of the cathode substrate are determined based on the curvature of the respective substrate, such that the one of the anode substrate and the cathode substrate with a larger curvature has a larger thickness. In this aspect, the thickness of the anode substrate alternatively or additionally may be between 2 and 18 micrometers. In this aspect, the thickness of the cathode substrate alternatively or additionally may be between 4 and 26 micrometers. In this aspect, the first curvature alternatively or additionally may be greater than the second curvature. In this aspect, the second curvature alternatively or additionally may be greater than the first curvature. In this aspect, the anode alternatively or additionally may be one of a plurality of anodes each arranged on a respective anode substrate, the cathode alternatively or additionally may be one of a plurality of cathodes each arranged on a respective cathode substrate, the separator alternatively or additionally may be one of a plurality of separators each arranged between a respective anode-cathode pair, and the battery alternatively or additionally may comprise a plurality of anode tabs, each anode tab coupled to a respective anode of the plurality of anodes, the plurality of anode tabs coupled together to form a battery anode tab, and a plurality of cathode tabs, each cathode tab coupled to a respective cathode of the plurality of cathodes, the plurality of cathode tabs coupled together to form a battery cathode tab. In this aspect, a thickness of a first cell formed of a first anode-cathode pair, a first anode substrate, a first cathode substrate, and a first separator alternatively or additionally may be greater than a thickness of a second cell formed of a second anode-cathode pair, a second anode substrate, a second cathode substrate, and a second separator, and a curvature of the first cell alternatively or additionally may be greater than a curvature of the second cell. In this aspect, a ratio of a curvature of an anode of the first anode-cathode pair to a thickness of the first anode substrate alternatively or additionally may be substantially equal to a ratio of a curvature of an anode of the second anode-cathode pair to a thickness of the second anode substrate, and a ratio of a curvature of a cathode of the first anode-cathode pair to a thickness of the first cathode substrate alternatively or additionally may be substantially equal to a ratio of a curvature of a cathode of the second anode-cathode pair to a thickness of the second cathode substrate. In this aspect, a thickness of the first separator alternatively or additionally may be greater than a thickness of the second separator. In this aspect, a thickness of the anode alternatively or additionally may differ from a thickness of the cathode. In this aspect, the anode substrate alternatively or additionally may be comprised of copper, and the cathode substrate alternatively or additionally may be comprised of aluminum.

Another aspect provides a method of manufacturing a battery comprising manufacturing two substrates to form an anode substrate curved at a first curvature and a cathode substrate curved at a second curvature, the one of the anode substrate and the cathode substrate with a larger curvature having a larger thickness, arranging an anode on the anode substrate, arranging a cathode on the cathode substrate, insulating the anode from the cathode with a separator, and providing tabs respectively coupled to the anode and the cathode. In this aspect, the thickness of the anode substrate alternatively or additionally may be between 2 and 18 micrometers. In this aspect, the thickness of the cathode substrate alternatively or additionally may be between 4 and 26 micrometers. In this aspect, the battery alternatively or additionally may be one of a plurality of cells manufactured according to the method of manufacturing the battery, and the method may alternatively or additionally comprise coupling together each of the tabs coupled to the anode of a respective cell to form a battery anode tab, and coupling together each of the tabs coupled to the cathode of a respective cell to form a battery cathode tab. In this aspect, a thickness of a first cell formed of a first anode-cathode pair, a first anode substrate, a first cathode substrate, and a first separator alternatively or additionally may be greater than a thickness of a second cell formed of a second anode-cathode pair, a second anode substrate, a second cathode substrate, and a second separator, a curvature of the first cell being greater than a curvature of the second cell.

Another aspect provides a portable electronic device comprising a housing including a curved portion, a curved display, and a curved battery electrically coupled to the display, the battery comprising an anode arranged on an anode substrate, a cathode arranged on a cathode substrate, the anode substrate being curved at a first curvature and the cathode substrate being curved at a second curvature, and a separator between the anode and the cathode, wherein a thickness of the anode substrate and a thickness of the cathode substrate are determined based on the curvature of the respective substrate, such that the one of the anode substrate and the cathode substrate with a larger curvature has a larger thickness. In this aspect, the curved battery alternatively or additionally may be one of a plurality of curved batteries, and a total thickness of the plurality of curved batteries alternatively or additionally may be between 20 µm and 80 µm. In this aspect, the portable electronic device alternatively or additionally may be a smartphone, and the curved battery alternatively or additionally may be arranged in the curved portion of the housing. In this aspect, the portable electronic device alternatively or additionally may be a head-mounted display device, and the curved battery alternatively or additionally may be arranged in the curved portion of the housing.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A battery, comprising:
   an anode arranged on an anode substrate;
   a cathode arranged on a cathode substrate, the anode substrate being curved at a first curvature and the cathode substrate being curved at a second curvature; and
   a separator between the anode and the cathode,
   wherein a thickness of the anode substrate and a thickness of the cathode substrate are determined based on the first curvature and the second curvature, respectively, such that the thickness of the anode substrate is larger than the thickness of the cathode substrate, and the first curvature is larger than the second curvature.

2. The battery of claim 1, wherein the thickness of the anode substrate is between 2 and 18 µm.

3. The battery of claim 1, wherein the thickness of the cathode substrate is between 4 and 26 µm.

4. The battery of claim 1, wherein
   the anode is one of a plurality of anodes each arranged on a respective anode substrate,
   the cathode is one of a plurality of cathodes each arranged on a respective cathode substrate,
   the separator is one of a plurality of separators each arranged between a respective anode-cathode pair, the battery further comprising:
   a plurality of anode tabs, each anode tab coupled to a respective anode of the plurality of anodes, the plurality of anode tabs coupled together to form a battery anode tab; and a plurality of cathode tabs, each cathode tab coupled to a respective cathode of the plurality of cathodes, the plurality of cathode tabs coupled together to form a battery cathode tab.

5. The battery of claim 4, wherein a thickness of a first cell formed of a first anode-cathode pair, a first anode substrate, a first cathode substrate, and a first separator is greater than a thickness of a second cell formed of a second anode-cathode pair, a second anode substrate, a second cathode substrate, and a second separator, a curvature of the first cell being greater than a curvature of the second cell.

6. The battery of claim 5, wherein
a ratio of a curvature of an anode of the first anode-cathode pair to a thickness of the first anode substrate is substantially equal to a ratio of a curvature of an anode of the second anode-cathode pair to a thickness of the second anode substrate, and
a ratio of a curvature of a cathode of the first anode-cathode pair to a thickness of the first cathode substrate is substantially equal to a ratio of a curvature of a cathode of the second anode-cathode pair to a thickness of the second cathode substrate.

7. The battery of claim 5, wherein a thickness of the first separator is greater than a thickness of the second separator.

8. The battery of claim 1, wherein a thickness of the anode differs from a thickness of the cathode.

9. The battery of claim 1, wherein
the anode substrate is comprised of copper, and
the cathode substrate is comprised of aluminum.

10. A method of manufacturing a battery, comprising:
manufacturing two substrates to form an anode substrate curved at a first curvature and a cathode substrate curved at a second curvature, a thickness of the anode substrate being larger than a thickness of the cathode substrate, and the first curvature being larger than the second curvature;
arranging an anode on the anode substrate;
arranging a cathode on the cathode substrate;
insulating the anode from the cathode with a separator; and
providing tabs respectively coupled to the anode and the cathode.

11. The method of claim 10, wherein the thickness of the anode substrate is between 2 and 18 µm.

12. The method of claim 10, wherein the thickness of the cathode substrate is between 4 and 26 µm.

13. The method of claim 10, wherein the battery is one of a plurality of cells manufactured according to the method of claim 10, the method further comprising:
coupling together each of the tabs coupled to the anode of a respective cell to form a battery anode tab; and
coupling together each of the tabs coupled to the cathode of a respective cell to form a battery cathode tab.

14. The method of claim 13, wherein a thickness of a first cell formed of a first anode-cathode pair, a first anode substrate, a first cathode substrate, and a first separator is greater than a thickness of a second cell formed of a second anode-cathode pair, a second anode substrate, a second cathode substrate, and a second separator, a curvature of the first cell being greater than a curvature of the second cell.

15. A portable electronic device, comprising:
a housing including a curved portion;
a curved display; and
a curved battery electrically coupled to the display, the battery comprising:
an anode arranged on an anode substrate;
a cathode arranged on a cathode substrate, the anode substrate being curved at a first curvature and the cathode substrate being curved at a second curvature; and
a separator between the anode and the cathode,
wherein a thickness of the anode substrate and a thickness of the cathode substrate are determined based on the first curvature and the second curvature, respectively, such that the thickness of the anode substrate is larger than the thickness of the cathode substrate, and the first curvature is larger than the second curvature.

16. The portable electronic device of claim 15, wherein the curved battery is one of a plurality of curved batteries, and
a total thickness of the plurality of curved batteries is between 20 µm and 80 µm.

17. The portable electronic device of claim 15, wherein the portable electronic device is a smartphone, and
the curved battery is arranged in the curved portion of the housing.

18. The portable electronic device of claim 15, wherein the portable electronic device is a head-mounted display device, and
the curved battery is arranged in the curved portion of the housing.

19. A battery, comprising:
an anode arranged on an anode substrate;
a cathode arranged on a cathode substrate, the anode substrate being curved at a first curvature and the cathode substrate being curved at a second curvature; and
a separator between the anode and the cathode,
wherein a thickness of the anode substrate and a thickness of the cathode substrate are determined based on the first curvature and the second curvature, respectively, such that the thickness of the cathode substrate is larger than the thickness of the anode substrate, and the second curvature is larger than the first curvature.

20. The battery of claim 19, wherein the thickness of the anode substrate is between 2 and 18 µm.

21. The battery of claim 19, wherein the thickness of the cathode substrate is between 4 and 26 µm.

22. The battery of claim 19, wherein
the anode is one of a plurality of anodes each arranged on a respective anode substrate,
the cathode is one of a plurality of cathodes each arranged on a respective cathode substrate,
the separator is one of a plurality of separators each arranged between a respective anode-cathode pair, the battery further comprising:
a plurality of anode tabs, each anode tab coupled to a respective anode of the plurality of anodes, the plurality of anode tabs coupled together to form a battery anode tab; and
a plurality of cathode tabs, each cathode tab coupled to a respective cathode of the plurality of cathodes, the plurality of cathode tabs coupled together to form a battery cathode tab.

23. The battery of claim 22, wherein a thickness of a first cell formed of a first anode-cathode pair, a first anode substrate, a first cathode substrate, and a first separator is greater than a thickness of a second cell formed of a second anode-cathode pair, a second anode substrate, a second cathode substrate, and a second separator, a curvature of the first cell being greater than a curvature of the second cell.

24. The battery of claim 23, wherein
a ratio of a curvature of an anode of the first anode-cathode pair to a thickness of the first anode substrate is substantially equal to a ratio of a curvature of an anode of the second anode-cathode pair to a thickness of the second anode substrate, and
a ratio of a curvature of a cathode of the first anode-cathode pair to a thickness of the first cathode substrate is substantially equal to a ratio of a curvature of a cathode of the second anode-cathode pair to a thickness of the second cathode substrate.

25. The battery of claim 23, wherein a thickness of the first separator is greater than a thickness of the second separator.

26. The battery of claim 19, wherein a thickness of the anode differs from a thickness of the cathode.

27. The battery of claim 19, wherein
the anode substrate is comprised of copper, and
the cathode substrate is comprised of aluminum.

28. A method of manufacturing a battery, comprising:
manufacturing two substrates to form an anode substrate curved at a first curvature and a cathode substrate curved at a second curvature, a thickness of the cathode substrate being larger than a thickness of the anode substrate, and the second curvature being larger than the first curvature;
arranging an anode on the anode substrate;
arranging a cathode on the cathode substrate;
insulating the anode from the cathode with a separator; and
providing tabs respectively coupled to the anode and the cathode.

29. The method of claim 28, wherein the thickness of the anode substrate is between 2 and 18 μm.

30. The method of claim 28, wherein the thickness of the cathode substrate is between 4 and 26 μm.

31. The method of claim 28, wherein the battery is one of a plurality of cells manufactured according to the method of claim 28, the method further comprising:
coupling together each of the tabs coupled to the anode of a respective cell to form a battery anode tab; and
coupling together each of the tabs coupled to the cathode of a respective cell to form a battery cathode tab.

32. The method of claim 31, wherein a thickness of a first cell formed of a first anode-cathode pair, a first anode substrate, a first cathode substrate, and a first separator is greater than a thickness of a second cell formed of a second anode-cathode pair, a second anode substrate, a second cathode substrate, and a second separator, a curvature of the first cell being greater than a curvature of the second cell.

33. A portable electronic device, comprising:
a housing including a curved portion;
a curved display; and
a curved battery electrically coupled to the display, the battery comprising:
an anode arranged on an anode substrate;
a cathode arranged on a cathode substrate, the anode substrate being curved at a first curvature and the cathode substrate being curved at a second curvature; and
a separator between the anode and the cathode,
wherein a thickness of the anode substrate and a thickness of the cathode substrate are determined based on the first curvature and the second curvature, respectively, such that the thickness of the cathode substrate is larger than the thickness of the anode substrate, and the second curvature is larger than the first curvature.

34. The portable electronic device of claim 33, wherein the curved battery is one of a plurality of curved batteries, and
a total thickness of the plurality of curved batteries is between 20 μm and 80 μm.

35. The portable electronic device of claim 33, wherein the portable electronic device is a smartphone, and
the curved battery is arranged in the curved portion of the housing.

36. The portable electronic device of claim 33, wherein the portable electronic device is a head-mounted display device, and
the curved battery is arranged in the curved portion of the housing.

* * * * *